US008053874B2

(12) United States Patent
Sun et al.

(10) Patent No.: US 8,053,874 B2
(45) Date of Patent: Nov. 8, 2011

(54) SEMICONDUCTOR PACKAGE HAVING A BRIDGE PLATE CONNECTION

(75) Inventors: Ming Sun, Sunnyvale, CA (US); Lei Shi, Shangai (CN); Kai Liu, Mountain View, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 374 days.

(21) Appl. No.: 12/321,761

(22) Filed: Jan. 23, 2009

(65) Prior Publication Data

US 2009/0218673 A1  Sep. 3, 2009

Related U.S. Application Data

(63) Continuation of application No. 11/799,467, filed on Apr. 30, 2007, now Pat. No. 7,683,464, which is a continuation-in-part of application No. 11/226,913, filed on Sep. 13, 2005, now abandoned.

(51) Int. Cl.
*H01L 23/495* (2006.01)
(52) U.S. Cl. .......................... 257/666; 257/692; 257/735

(58) Field of Classification Search .................. 257/690, 257/735, E23.014, E23.034, E23.044, 666, 257/675, 678, 692, 693, 698, 713, 784, E23.08
See application file for complete search history.

(56) References Cited

U.S. PATENT DOCUMENTS

7,683,464 B2 * 3/2010 Sun et al. ...................... 257/666
* cited by examiner

*Primary Examiner* — Roy Potter
(74) *Attorney, Agent, or Firm* — Jing Ming Cai; Schein & Cai LLP (57) ABSTRACT

A semiconductor package is disclosed. The package includes a leadframe having drain, source and gate leads, a semiconductor die coupled to the leadframe, the semiconductor die having a plurality of metalized source areas and a metalized gate area, a patterned source connection having a plurality of dimples formed thereon coupling the source lead to the semiconductor die metalized source areas, a patterned gate connection having a dimple formed thereon coupling the gate lead to the semiconductor die metalized gate area, a semiconductor die drain area coupled to the drain lead, and an encapsulant covering at least a portion of the semiconductor die and drain, source and gate leads.

13 Claims, 11 Drawing Sheets

SECTION A-A

FIG. 8

SECTION B-B

SECTION A-A

FIG. 12

SECTION B-B

SEMICONDUCTOR PACKAGE HAVING A BRIDGE PLATE CONNECTION

CROSS REFERENCE TO RELATED APPLICATIONS

The present invention is a continuation application which claims priority under 35 U.S.C. 120 from Ser. No. 11/799,467 filed on Apr. 30, 2007 now U.S. Pat. No. 7,683,464 entitled "Semiconductor Package Having Dimpled Plate Interconnections" which is in turn a continuation-in-part application of Ser. No. 11/226,913 filed on Sep. 13, 2005 now abandoned entitled "Semiconductor Package Having Plate Interconnections", the entire specifications of which are incorporated herein by reference.

BACKGROUND OF THE INVENTION

The present invention generally relates to a semiconductor package and more particularly to a semiconductor package having a bridged plate connecting a power semiconductor device source metalized contact and a leadframe source lead.

Semiconductor devices are conventionally connected to leadframe leads using either plate interconnections or wire bonding. For example, U.S. Pat. No. 5,821,611 discloses a semiconductor device which comprises a first lead having a tip formed with an island, a semiconductor chip unit mounted on the island of the first lead by means of a solder layer and having a plurality of electrode bumps projecting away from the island, and a plurality of additional leads each of which has a tip electrically connected to the electrode bumps via respective solder deposits. The additional leads include at least second and third leads. The leads are alloyed to the electrode bumps in a heating furnace and the solder bumps may spread during heating and create undesirable shapes.

U.S. Pat. No. 6,040,626 discloses a semiconductor package which employs a mixed connection between a MOSFET top surface comprising a low resistance plate portion for connecting to a source and a wire bond for connecting to a gate. Wire bonding may introduce short circuits in the device due to device dielectric layer damage during the wire bonding process.

A semiconductor package with directly connected leads is disclosed in U.S. Pat. No. 6,249,041. A semiconductor device includes a semiconductor chip with contact areas on the top or bottom surface. A first lead assembly, formed from a semi-rigid sheet of conductive material, has a lead assembly contact attached to one of the contact areas of the semiconductor chip. The first lead assembly also has at least one lead connected to and extending from the lead assembly contact. A second lead assembly, also formed from a semi-rigid sheet of conductive material, has a lead assembly contact attached to another one of the contact areas of the semiconductor chip. The second lead assembly also has at least one lead connected to and extending from the lead assembly contact. An encapsulant encloses the semiconductor chip, the lead assembly contact of the first lead assembly and the lead assembly contact of the second lead assembly. The semiconductor device has low electrical and thermal resistance contributions from the package due to the direct connection of the lead assemblies to the chip. The lead assembly contact areas are held in contact with lead contact areas on the semiconductor chip by an electrically conductive adhesive layer. The electrically conductive adhesive layer may be a silver-filled epoxy or polyimide paste or solder bumps. The adhesive layer may be cured in a curing oven, if necessary. The adhesive layer does not include soft solder or solder paste.

Another semiconductor package with directly connected leads is disclosed in U.S. Pat. No. 6,479,888. A MOSFET comprises a plurality of inner leads electrically connected to a surface electrode of a semiconductor pellet having a field effect transistor on a principal surface thereof. The inner leads are mechanically and electrically connected to the principal surface by a gate connecting portion and source connecting portions constituted by bumps.

A common problem encountered in the use of patterned plate or clip interconnections is that the plates or clips may float during solder reflow and result in a misaligned interconnection. In some cases, the misalignment results in a short circuit between the source and gate contact areas resulting in low assembly yields. Furthermore, it is difficult to control the required solder volume to prevent this problem.

Another problem resulting from the use of patterned plate or clip interconnections is the thermal expansion mismatch between the silicon of the semiconductor device and the metal of the patterned plate or clip. The larger the contact area of the patterned plate or clip, the higher the stress induced by the mismatch, which often results in die cracking. To reduce the stress, a smaller plate or clip may be used. However, the smaller contact area may result in higher resistance.

There is therefore a need in the art for a semiconductor package that includes a semiconductor power device connected to leadframe source and gate leadframe contact areas by means of patterned plates that overcomes the problems of the prior art. There is also a need for a patterned plate interconnection that does not float during solder reflow and ensures precise clip placement and location assurance. There is also a need for a semiconductor package having device metallized areas for restricting the flow of solder during the soldering process. There is also a need for a metalized area formed of Ni/Au. There is also a need for a semiconductor package process that increases throughput and provides easier assembly process control. There is also a need for a semiconductor package method that provides a soft attachment process of the patterned plates onto the semiconductor power device. There is also a need for a semiconductor package having an exposed source plate. There is also a need for a semiconductor package having reduced electrical resistance. There is a further need for a semiconductor package having improved thermal dissipation properties. There is also a need for a semiconductor package having improved mechanical properties.

SUMMARY OF THE INVENTION

The present invention overcomes the limitations of the prior art by providing a semiconductor device package having plate connections between leadframe source and gate contact areas and a power semiconductor power device source and gate metalized areas. The plate connections include dimples positioned to correspond to the source and gate metalized areas. A portion of the source plate may be exposed to allow for improved thermal dissipation.

In accordance with another aspect of the invention, a semiconductor package includes a leadframe having drain, source and gate leads, a semiconductor die coupled to the leadframe, the semiconductor die having a plurality of metalized source areas and a metalized gate area, a patterned source connection having a plurality of dimples formed thereon coupling the source lead to the semiconductor die metalized source areas, the dimples being positioned for contact with the metalized source areas, a patterned gate connection having a dimple formed thereon coupling the gate lead to the semiconductor die metalized gate area, the dimple being positioned for contact with the metalized gate area, a semiconductor die drain area coupled to the drain lead, and an encapsulant covering at least a portion of the semiconductor die and drain, source and gate leads.

In accordance with yet another aspect of the invention, a semiconductor package includes a leadframe having drain, source and gate leads, a semiconductor die coupled to the leadframe, the semiconductor die having a plurality of Ni/Au metalized source areas and a Ni/Au metalized gate area, a patterned source connection having a plurality of dimples formed thereon, the plurality of dimples coupling the source lead to the semiconductor die metalized source areas in corresponding relationship therewith, the patterned source connection being soldered to the semiconductor die metalized source areas, a patterned gate connection having a dimpled formed thereon, the dimple coupling the gate lead to the semiconductor die metalized gate area in corresponding relationship therewith, the patterned gate connection being soldered to the semiconductor die metalized gate area, a semiconductor die drain area coupled to the drain lead, and an encapsulant covering at least a portion of the semiconductor die and drain, source and gate leads.

There has been outlined, rather broadly, the more important features of the invention in order that the detailed description thereof that follows may be better understood, and in order that the present contribution to the art may be better appreciated. There are, of course, additional features of the invention that will be described below and which will form the subject matter of the claims appended herein.

In this respect, before explaining at least one embodiment of the invention in detail, it is to be understood that the invention is not limited in its application to the details of design and to the arrangement of components set forth in the following description or illustrated in the drawings. The invention is capable of other embodiments and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other methods and systems for carrying out the several purposes of the present invention. It is important, therefore, that the claims be regarded as including such equivalent methods and systems insofar as they do not depart from the spirit and scope of the present invention.

DETAILED DESCRIPTION OF THE INVENTION

The following detailed description is of the best modes of carrying out the invention. The description is not to be taken in a limiting sense, but is made merely for the purpose of illustrating the general principles of the invention, since the scope of the invention is best defined by the appended claims.

The present invention generally provides a semiconductor device package having plate connections between leadframe source and gate contact areas and power semiconductor power device metalized source and gate areas. The metalized source and gate areas are preferably Ni/Au plated or sputtered surfaces. The metalized source and gate areas provide for improved bonding of the plate connections and reduction of overbonding which often introduces short circuit problems due to dielectric layer damage during wire bonding processes. The metalized source and gate areas further eliminate the need for solder bumps and epoxy adhesive layers as soft solder and solder paste may be used to connect the plates to the metalized source and gate areas.

In a first aspect of the invention and with reference to FIGS. 1-5, a semiconductor package generally designated 100 may include a leadframe 105 having a drain contact portion 107, a source contact portion 110 and a gate contact portion 115. A power semiconductor die 120 may have a metalized drain area (not shown) coupled to the drain contact portion 107 by solder reflow.

Figure 3:
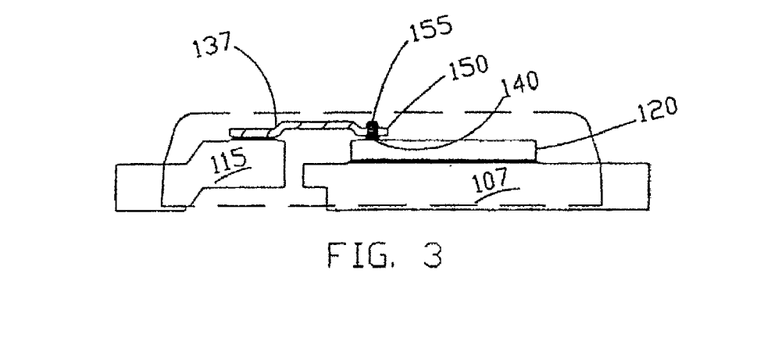
FIG. 3 is a cross sectional view of the semiconductor package of FIG. 1 taken along line 3-3 in accordance with the invention.
Figure 3A:
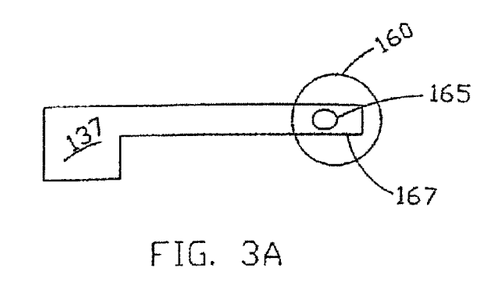
FIG. 3A is a schematic representation of a patterned gate connection disposed over a metalized gate area in accordance with the invention.

Semiconductor source and gate metalized areas may be formed by Ni/Au plating or sputtering. With reference to FIG. 3A, a gate metalized area 160 may be of circular configuration. It has been discovered by the inventors that circular metalized area 160 advantageously restricts the flow of soft solder and solder paste to the confines of the circular metalized area 160 during solder reflow, thereby reducing the incidence of undesirable shapes and short circuits.

Figure 1:
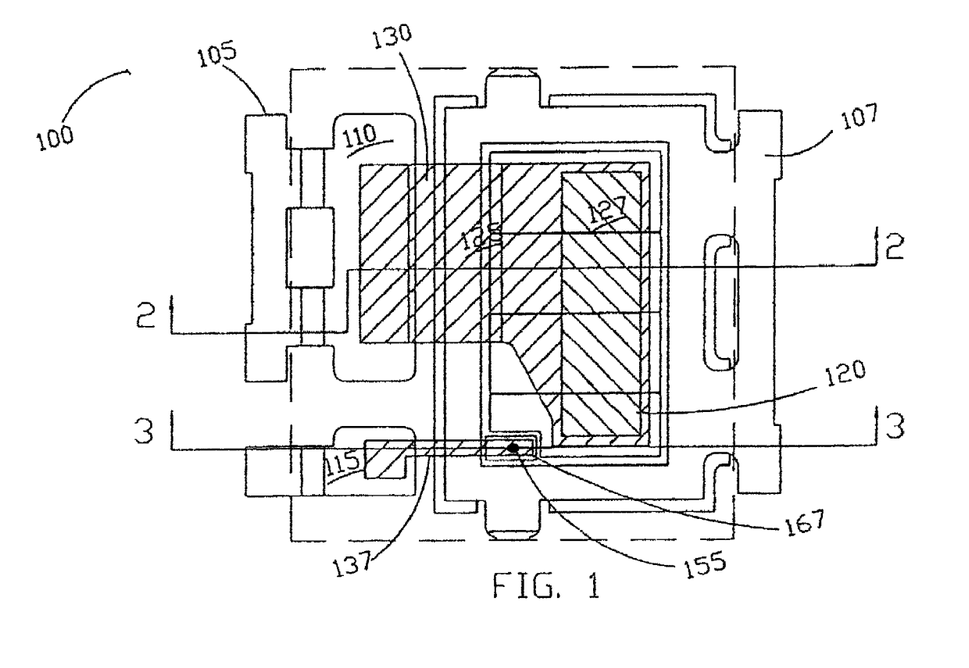
FIG. 1 is schematic representation of a semiconductor package in accordance with the invention.
Figure 2:
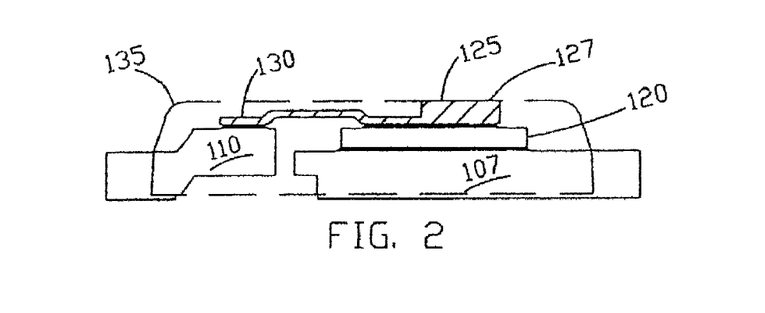
FIG. 2 is a cross sectional view of the semiconductor package of FIG. 1 taken along line 2-2 in accordance with the invention.

A patterned source plate 125 may include an exteriorly exposed portion 127 and an internal portion 130. Interior portion 130 may be coupled to source contact portion 110. Exteriorly exposed portion 127 may be exposed outside of an encapsulant 135. Patterned source plate 125 may be coupled to the metalized source area by solder reflow using soft solder or solder paste. Metalized source area may cover a substantial portion of a top surface of the die 120 for improved heat dissipation and decreased resistance and inductance.

Figure 3B:
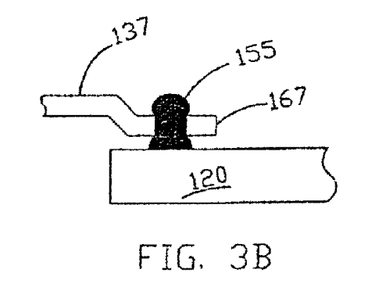
FIG. 3B is a schematic representation of a gate lock in accordance with the invention.

A patterned gate plate 137 may connect the metalized gate area 160 to the leadframe gate contact area 115. The patterned gate plate 137 may include a hole 165 formed at an end 167 thereof. A locking ball 155 may be formed during solder reflow to provide mechanical stability to the patterned gate plate 137 (FIG. 3B). In one aspect of the invention, soft solder may be disposed in the hole 165 and allowed to flow through the hole 165 to the metalized gate area 160 during solder reflow. Metalized gate area 160 may provide a bonding surface for the solder which limits the flow of solder to the circular area.

Figure 3C:
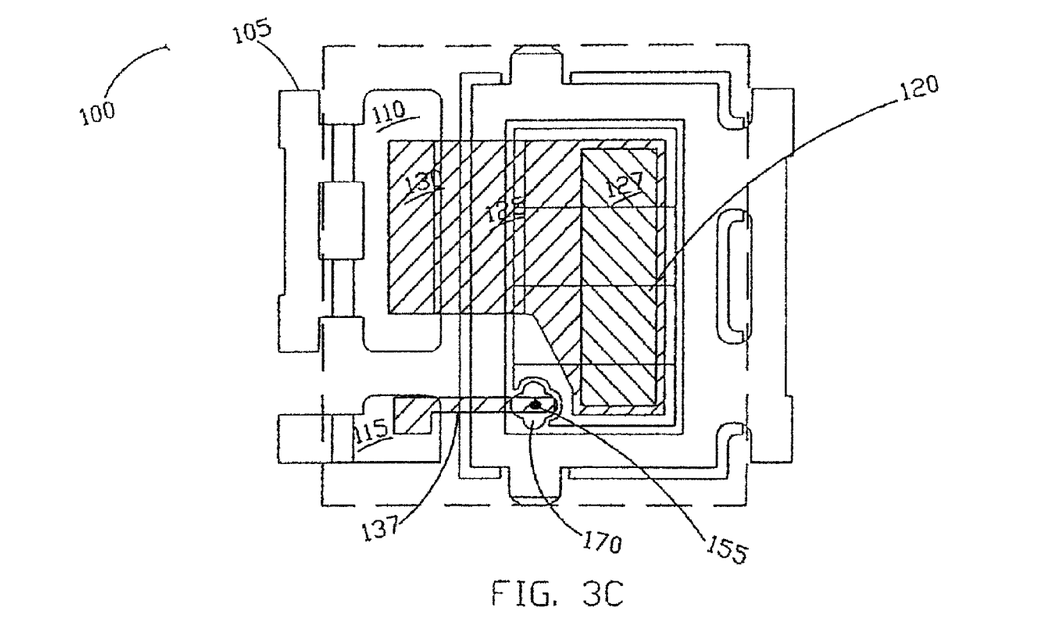
FIG. 3C is a schematic representation of the semiconductor package of FIG. 1 showing an alternative metalized gate area in accordance with the invention.
Figure 4:
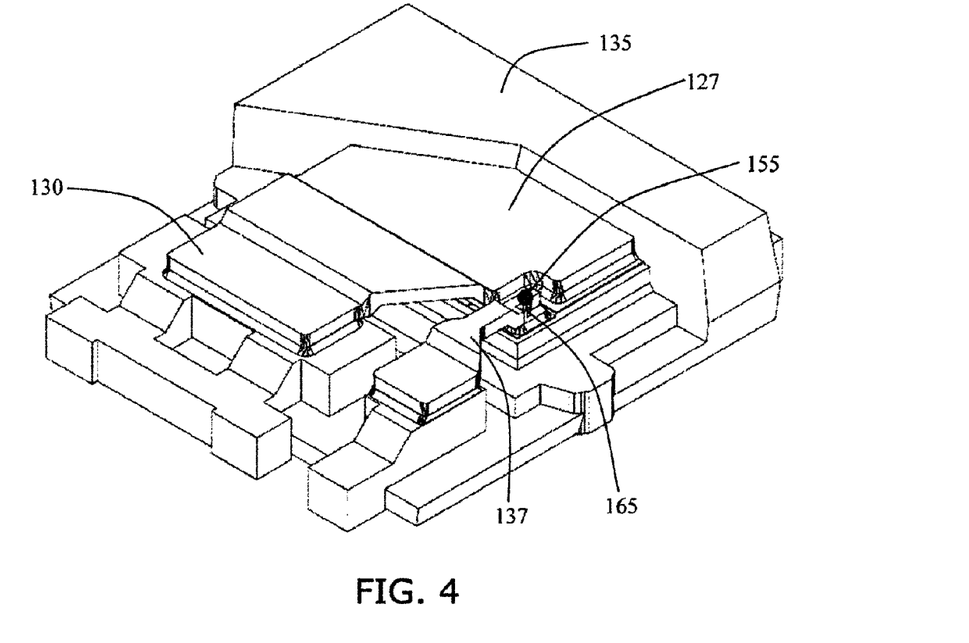
FIG. 4 is a view in partial section of the semiconductor package of FIG. 1 in accordance with the invention.
Figure 5:
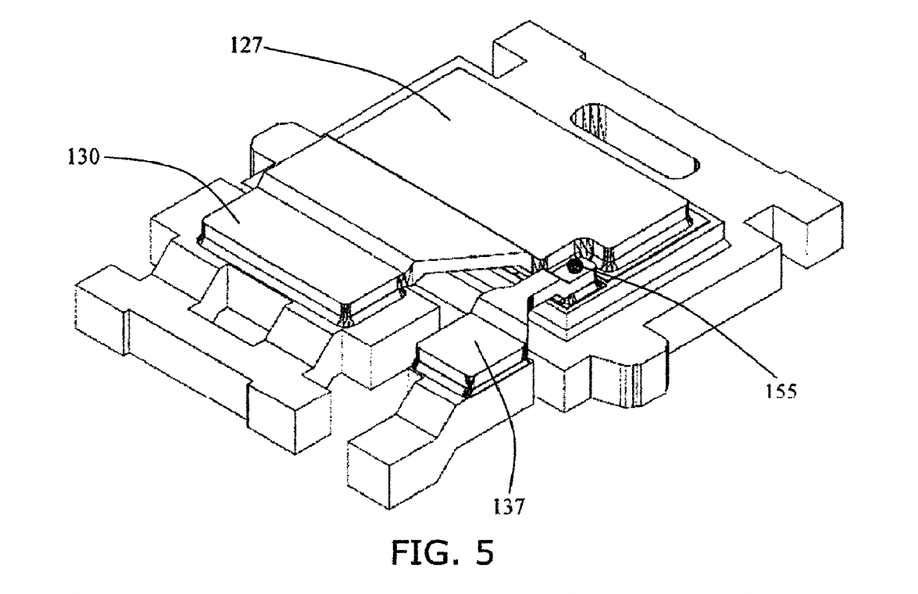
FIG. 5 is another view in partial section of the semiconductor package of FIG. 1 in accordance with the invention.
Figure 6:
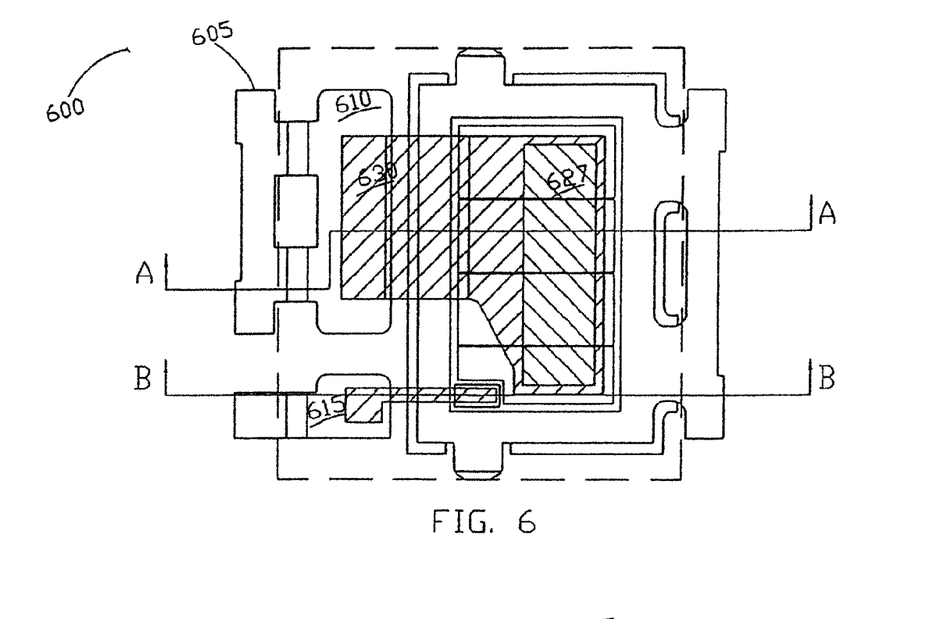
FIG. 6 is a schematic representation of an alternative embodiment of the semiconductor package in accordance with the invention.
Figure 7:
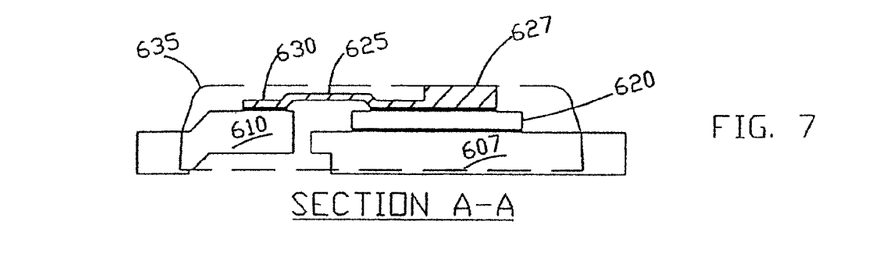
FIG. 7 is a cross sectional view of the semiconductor package of FIG. 6 taken along line A-A in accordance with the invention.
Figure 8:
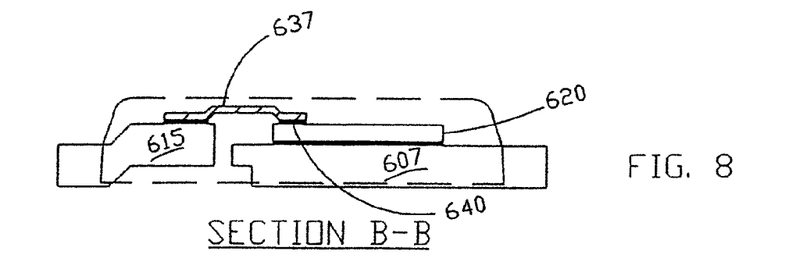
FIG. 8 is a cross sectional view of the semiconductor package of FIG. 6 taken along line B-B in accordance with the invention.
Figure 9:
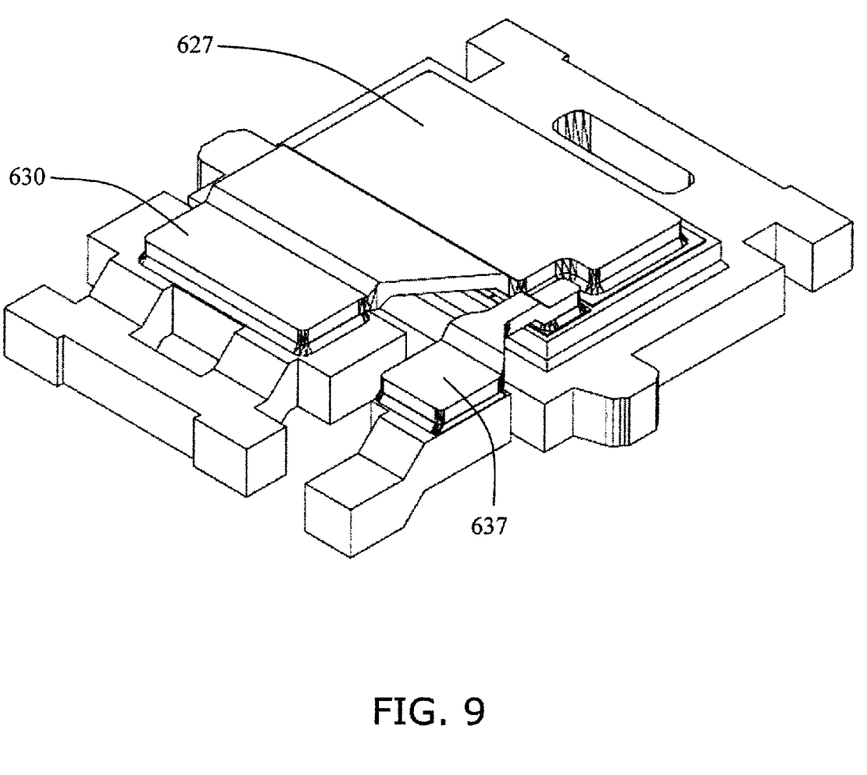
FIG. 9 is a view in partial section of the semiconductor package of FIG. 6 in accordance with the invention.

With reference to FIG. 3C, an alternative metalized gate area 170 is shown including a cross-shaped area.

In accordance with another aspect of the invention, and as shown in FIGS. 6-9, a semiconductor package generally designated 600 may include a leadframe 605 having a drain contact portion 607, a source contact portion 610 and a gate contact portion 615. A power semiconductor die 620 may have a metalized drain area (not shown) coupled to the drain contact portion 607 by solder reflow.

Semiconductor source and gate metalized areas may be formed by Ni/Au plating or sputtering. A patterned source plate 625 may include an exteriorly exposed portion 627 and an internal portion 630. Exteriorly exposed portion 627 may be exposed outside of an encapsulant 635. Patterned source plate 625 may be coupled to the metalized source area by solder reflow using soft solder or solder paste.

A patterned gate plate 637 may connect the metalized gate area 640 to the leadframe gate contact area. The patterned gate plate 637 may be connected to the metalized gate area 640 by solder reflow to provide mechanical stability to the patterned gate plate 637.

Figure 10:
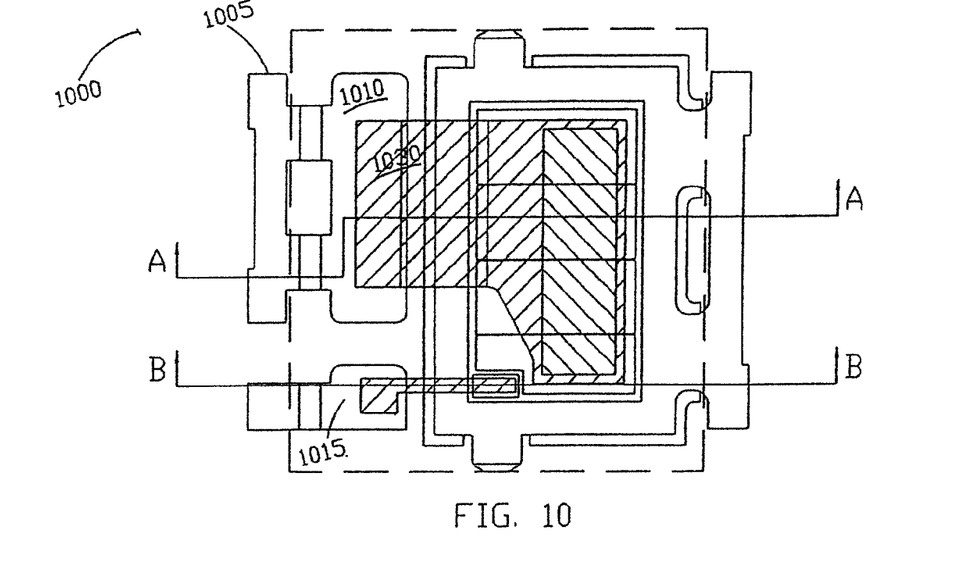
FIG. 10 is a schematic representation of an alternative embodiment of the semiconductor package in accordance with the invention.
Figure 11:
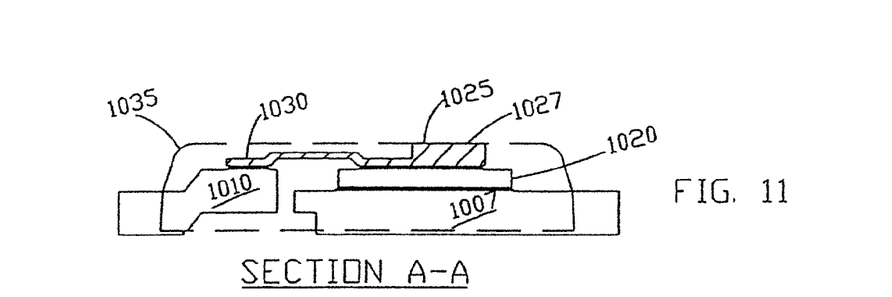
FIG. 11 is a cross sectional view of the semiconductor package of FIG. 10 taken along line A-A in accordance with the invention.
Figure 12:
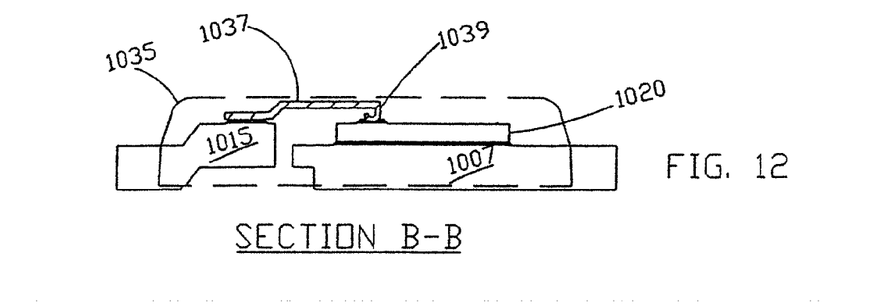
FIG. 12 is a cross sectional view of the semiconductor package of FIG. 10 taken along line B-B in accordance with the invention.
Figure 13:
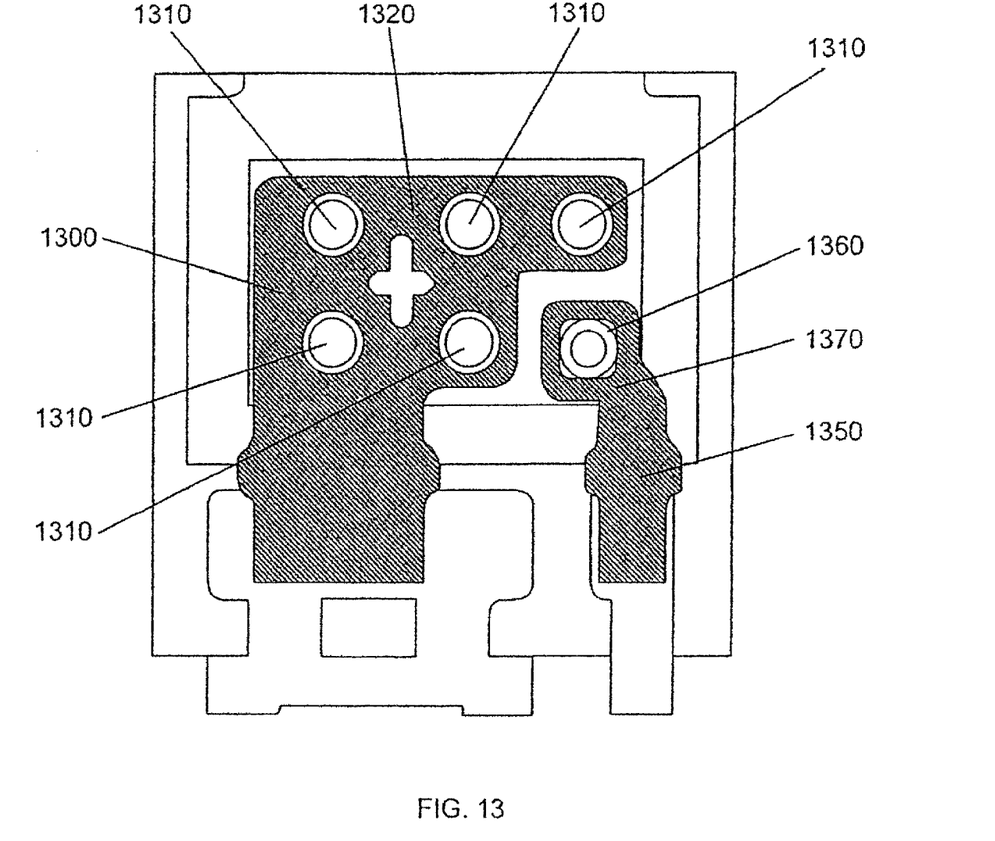
FIG. 13 is a schematic representation of an embodiment of the semiconductor package having dimpled plate interconnections in accordance with the invention.
Figure 14:
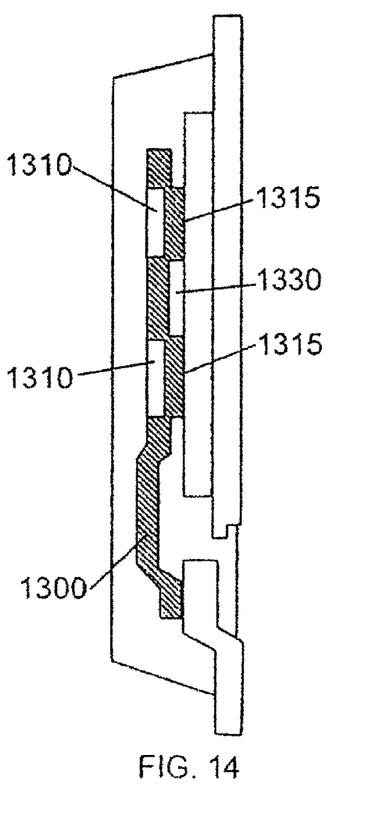
FIG. 14 is a cross sectional view of a dimpled source plate of the semiconductor package of FIG. 13.
Figure 15:
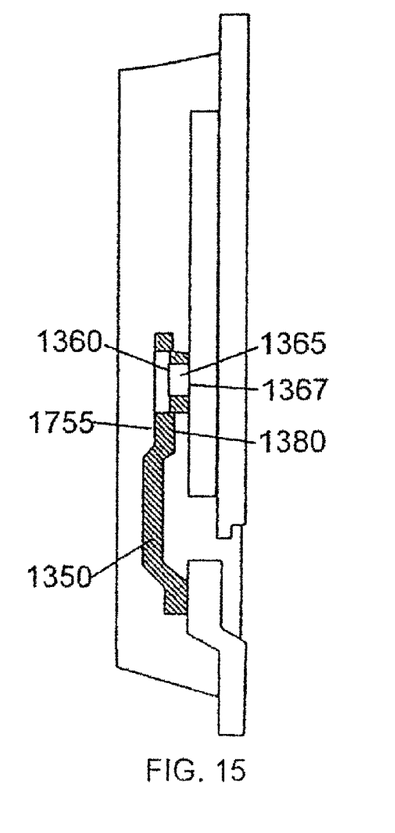
FIG. 15 is a cross sectional view of a dimpled gate plate of the semiconductor package of FIG. 13.
Figure 16:
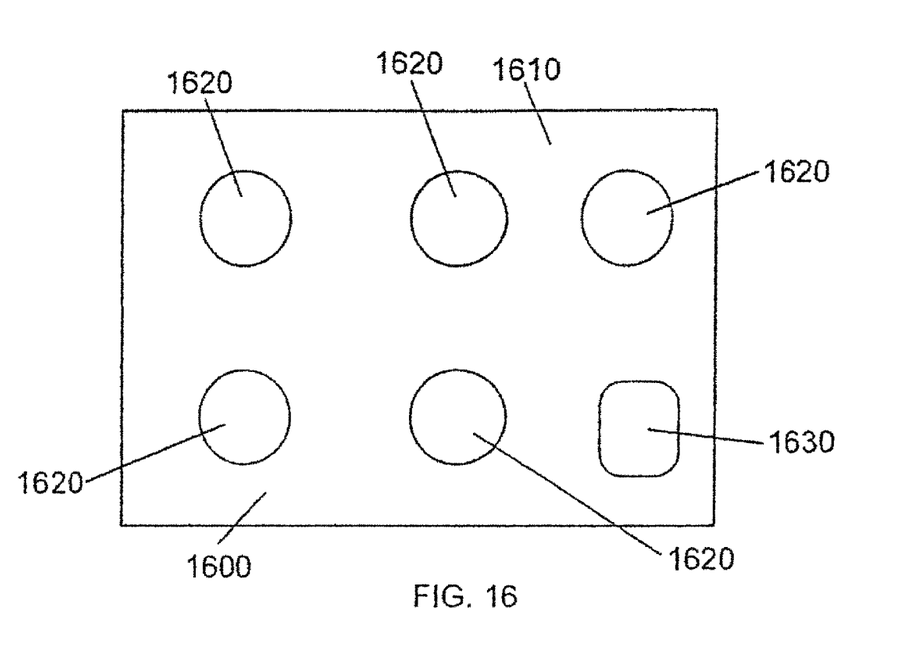
FIG. 16 is a schematic representation of a semiconductor die in accordance with the invention.

In another aspect of the invention and with reference to FIGS. 10-12, a semiconductor package generally designated 1000 may include a leadframe 1005 having a drain contact portion 1007, a source contact portion 1010 and a gate contact portion 1015. A power semiconductor die 1020 may have a metalized drain area (not shown) coupled to the drain contact portion 1007 by solder reflow.

Semiconductor source and gate metalized areas may be formed by Ni/Au plating or sputtering. A patterned source plate 1025 may include an exteriorly exposed portion 1027 and an internal portion 1030. Exteriorly exposed portion 1027 may be exposed outside of an encapsulant 1035. Patterned source plate 1025 may be coupled to the metalized source area by solder reflow using soft solder or solder paste.

A patterned gate plate 1037 may connect the metalized gate area 1040 to the leadframe gate contact area. Patterned gate plate 1037 may include a hook portion 1039 for connection to the metalized gate area 1040. The patterned gate plate 1037 may be connected to the metalized gate area 1040 by solder reflow to provide mechanical stability to the patterned gate plate 1037.

The present invention advantageously employs Ni/Au device patterned source, drain and gate metalized areas. Ni/Au provides for improved connection between the patterned source plates and patterned gate plates and allows for a simplified process of source, drain and gate metallization in one Ni/Au process to thereby improve process throughput.

The Ni/Au process provides for a Ni layer on the metal areas and a Au layer to protect the Ni layer. As Ni does not diffuse into the Al metal area, an inter-metallic layer comprised of Ni/Al provides for a high density layer to which the patterned source and gate connections may be soldered.

In another aspect of the invention, and with reference to FIG. 13, FIG. 14, FIG. 15, and FIG. 16, a source plate 1300 includes a plurality of dimples 1310 formed thereon. The dimples 1310 are concave with respect to a top surface 1320 of the source plate 1300 and have bottom surfaces 1315 extending beyond a plane of a bottom surface 1330 thereof. A gate plate 1350 includes a dimple 1360 that is concave with respect to a top surface 1370 of the gate plate 1350 and has a through hole 1365 having an opening 1367 that extends beyond a plane of a bottom surface 1380 thereof.

Source plate dimples 1310 and the gate plate dimple 1360 are positioned and stamped or punched on the source plate 1300 and the gate plate 1350 so as to align with source metalized areas 1620 and gate metalized area 1630 of semiconductor die 1600 during solder reflow. It has been found that the source plate 1300 is not prone to floating due to the number of distinct source plate dimples 1310 contacting the source metalized areas 1630. Furthermore, the metalized areas advantageously restrict the flow of soft solder and solder paste to the confines of the metalized areas during solder reflow, thereby reducing the incidence of undesirable shapes and short circuits. The through hole 1367 the gate dimple 1360 allows for the formation of locking balls formed during solder reflow to provide mechanical stability to the gate plate 1350.

Figure 17:
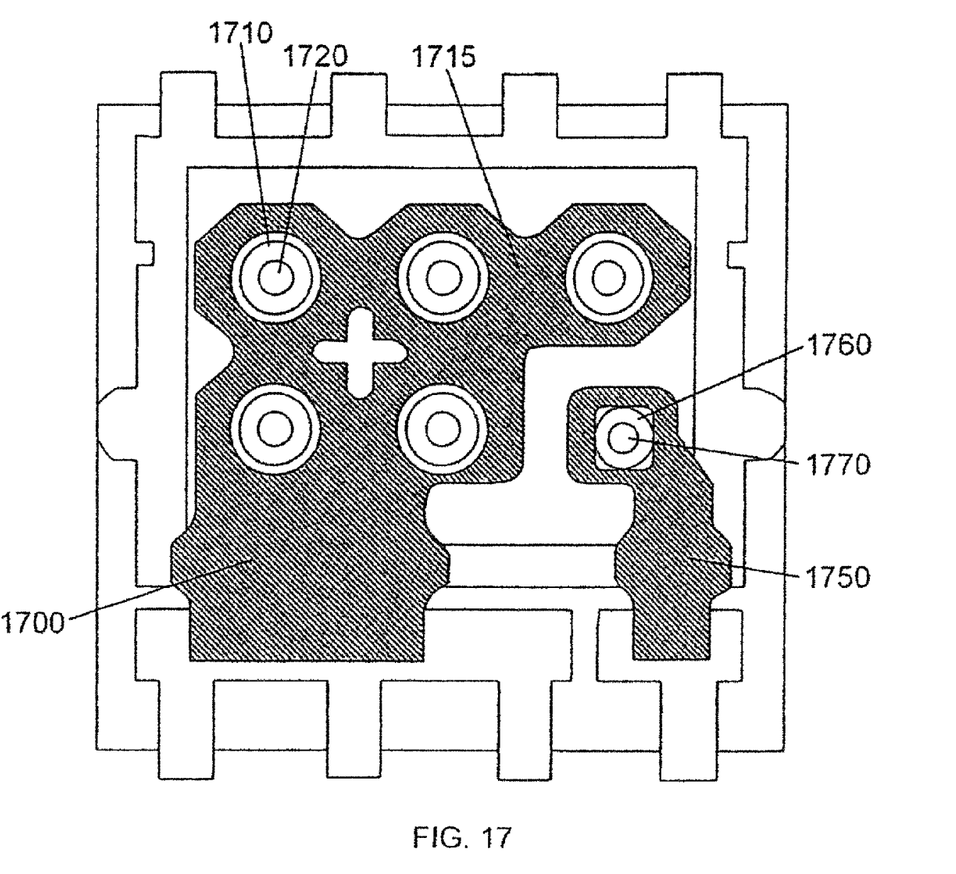
FIG. 17 is a schematic representation of an alternative embodiment of the semiconductor package having dimpled plate interconnections in accordance with the invention.
Figure 18:
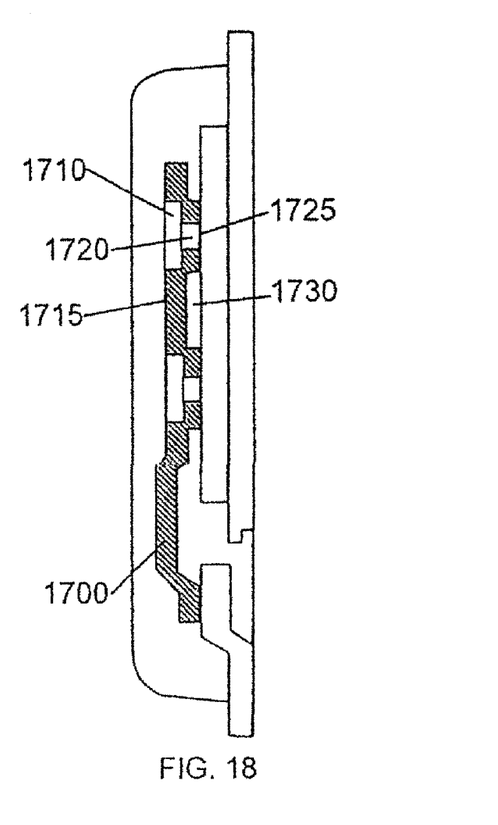
FIG. 18 is a cross sectional view of a dimpled source plate of the semiconductor package of FIG. 17.
Figure 19:
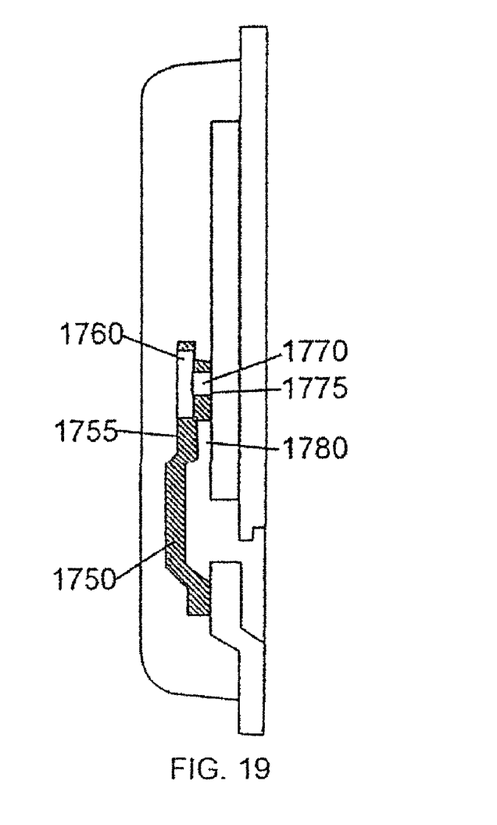
FIG. 19 is a cross sectional view of a dimpled gate plate of the semiconductor package of FIG. 17.

In another aspect of the invention, and with reference to FIG. 17, FIG. 18, and FIG. 19 a source plate 1700 includes a plurality of dimples 1710 formed thereon. The dimples 1710 are concave with respect to a top surface 1715 of the source plate 1700 and include a through hole 1720 having an opening 1725 formed beyond a plane of a bottom surface 1730 thereof. A gate plate 1750 includes a dimple 1760 that is concave with respect to a top surface 1755 of the gate plate 1750 and includes a through hole 1770 having an opening 1775 formed beyond a plane of a bottom surface 1780 thereof.

As in the embodiment shown in FIGS. 13-16, the source dimples 1710 and the gate dimple 1760 are positioned and stamped or punched on the source plate 1700 and the gate plate 1750 so as to align with source metalized areas 1620 and gate metalized area 1630 of semiconductor die 1600 during solder reflow. The through holes 1720 of the source dimples 1710 and the through hole 1770 of the gate dimple 1760 allow for the formation of locking balls formed during solder reflow to provide mechanical stability to the source and gate plates 1700 and 1750 respectively. Soft solder may be disposed in the source dimples 1710 and the gate dimple 1760 and allowed to flow through the through holes 1720 and 1770 to the metalized source areas 1620 and metalized gate area 1630 respectively during solder reflow. Metalized source areas 1620 and metalized gate area 1630 may provide bonding surfaces for the solder which limits the flow of solder to the metalized areas.

The present invention advantageously provides for patterned source and gate plate connections having dimples positioned to correspond to source and gate metalized areas. The dimpled source and gate plates ensure that the source and gate plates do not float during solder reflow to thereby ensure precise clip placement and location assurance.

It should be understood, of course, that the foregoing relates to preferred embodiments of the invention and that modifications may be made without departing from the spirit and scope of the invention as set forth in the following claims.

We claim:

1. A semiconductor package comprising:
   a leadframe having drain, source and gate leads;
   a semiconductor die coupled to the leadframe, the semiconductor die having a plurality of metalized source areas and a metalized gate area;
   a patterned source connection having a plurality of dimples formed thereon coupling the source lead to the semiconductor die metalized source areas, the dimples being positioned for contact with the metalized source area;
   a semiconductor die drain area coupled to the drain lead; and
   an encapsulant covering at least a portion of the semiconductor die and drain, source and gate leads.

2. The semiconductor package of claim 1, further comprising a patterned gate connection having a dimple formed thereon coupling the gate lead to the semiconductor die metalized gate area, the dimple being positioned for contact with the metalized gate area.

3. The semiconductor package of claim 2, wherein the metalized source areas and the metalized gate area comprise circular metalized areas insulated by passivation areas.

4. The semiconductor package of claim 2, wherein the plurality of source dimples and the gate dimple each comprise a through hole through which the patterned source connection and the patterned gate connection are soldered to respective source metalized areas and gate metalized area.

5. The semiconductor package of claim 4, wherein the solder forms a lock at a top portion of the patterned source connections and the patterned gate connection.

6. The semiconductor package of claim 2, wherein the metalized source areas and the metalized gate area comprise an upper Ni/Au layer.

7. The semiconductor package of claim 2, wherein the drain area comprises a metalized drain area.

8. The semiconductor package of claim 7, wherein the metalized drain area comprises an upper NI/Au layer.

9. The semiconductor package of claim 1, wherein a bottom portion of the drain lead is exposed through the encapsulant.

10. A semiconductor package comprising:
    a leadframe having drain, source and gate leads;
    a semiconductor die coupled to the leadframe, the semiconductor die having a plurality of Ni/Au metalized source areas and a Ni/Au metalized gate area;
    a patterned source connection having a plurality of dimples formed thereon, the plurality of dimples coupling the source lead to the semiconductor die metalized source areas in corresponding relationship therewith, the patterned source connection being soldered to the semiconductor die metalized source areas;
    a semiconductor die drain area coupled to the drain lead; and an encapsulant covering at least a portion of the semiconductor die and drain, source and gate leads.

11. The semiconductor package of claim 10, further comprising a patterned gate connection having a dimpled formed thereon, the dimple coupling the gate lead to the semiconductor die metalized gate area in corresponding relationship therewith, the patterned gate connection being soldered to the semiconductor die metalized gate area.

12. The semiconductor package of claim 10, wherein the plurality of source dimples and the gate dimple each comprise a through hole through which the patterned source connection and the patterned gate connection are soldered to respective source metalized areas and gate metalized area.

13. The semiconductor package of claim 11, wherein the solder forms a lock at a top portion of the patterned source connections and the patterned gate connection.

* * * * *